US012743609B2

(12) United States Patent
Aytekin et al.

(10) Patent No.: US 12,743,609 B2
(45) Date of Patent: Sep. 22, 2026

(54) APPARATUS AND A METHOD FOR NEURAL NETWORK COMPRESSION

(71) Applicant: Nokia Technologies Oy, Espoo (FI)

(72) Inventors: Caglar Aytekin, Tampere (FI); Francesco Cricri, Tampere (FI)

(73) Assignee: Nokia Technologies Oy, Espoo (FI)

( * ) Notice: Subject to any disclaimer, the term of this patent is extended or adjusted under 35 U.S.C. 154(b) by 1091 days.

(21) Appl. No.: 17/431,012

(22) PCT Filed: Jan. 29, 2020

(86) PCT No.: PCT/FI2020/050045

§ 371 (c)(1),
(2) Date: Aug. 13, 2021

(87) PCT Pub. No.: WO2020/165491

PCT Pub. Date: Aug. 20, 2020

(65) Prior Publication Data

US 2022/0164652 A1 May 26, 2022

(30) Foreign Application Priority Data

Feb. 15, 2019 (FI) ..................................... 20195116

(51) Int. Cl.
*G06N 3/0495* (2023.01)
*G06N 3/082* (2023.01)
(Continued)

(52) U.S. Cl.
CPC ........... *G06N 3/0495* (2023.01); *G06N 3/082* (2013.01); *G06V 10/764* (2022.01); *G06V 10/82* (2022.01); *H03M 7/3068* (2013.01)

(58) Field of Classification Search
CPC ... H03M 7/3068; G06V 10/82; G06V 10/764; G06V 3/08; G06N 3/08; G06N 3/082
See application file for complete search history.

(56) References Cited

U.S. PATENT DOCUMENTS 6,219,682 B1 * 4/2001 Terashima .............. G06F 17/16 359/107
11,537,870 B1 * 12/2022 Teig ......................... G06N 3/08
(Continued)

FOREIGN PATENT DOCUMENTS

CN 108227024 A * 6/2018 ............. G01V 3/081
CN 109188327 A * 1/2019 ............. A61B 5/055
WO WO-2017149559 A1 * 9/2017 ........... G06K 9/6215

OTHER PUBLICATIONS

Glorot, et al., (May 13-15, 2010) Understanding the difficulty of training deep feedforward neural networks, Proceedings of the Thirteenth International Conference on Artificial Intelligence and Statistics, PMLR 9:249-256. (Year: 2010).*

(Continued)

*Primary Examiner* — James Trujillo
(74) *Attorney, Agent, or Firm* — McCarter & English, LLP; Joseph C. Drish

(57) ABSTRACT

There is provided an apparatus comprising means for training a neural network, wherein the training comprises applying a loss function configured to increase sparsity of a weight tensor of the neural network and to cause a plurality of non-zero elements of the weight tensor to be substantially equal to each other; and means for entropy coding the weight tensor to obtain a compressed neural network.

16 Claims, 2 Drawing Sheets

200 training a neural network, wherein the training comprises applying a loss function configured to increase sparsity of a weight tensor of the neural network and to cause a plurality of non-zero elements of the weight tensor to be substantially equal to each other (210)

entropy coding the weight tensor to obtain a compressed neural network (220)

(51) Int. Cl.
*G06V 10/764* (2022.01)
*G06V 10/82* (2022.01)
*H03M 7/30* (2006.01)

(56) References Cited

U.S. PATENT DOCUMENTS

| | | | | |
|---|---|---|---|---|
| 2009/0287624 | A1* | 11/2009 | Rouat | G06N 3/049 706/26 |
| 2016/0125249 | A1* | 5/2016 | Mei | G06V 20/56 382/103 |
| 2017/0270408 | A1 | 9/2017 | Shi et al. | |
| 2018/0114113 | A1* | 4/2018 | Ghahramani | G06N 3/0985 |
| 2019/0251445 | A1* | 8/2019 | Movshovitz-Attias | G06N 3/084 |
| 2020/0008686 | A1* | 1/2020 | Khair | A61B 5/029 |
| 2020/0097818 | A1* | 3/2020 | Li | G06N 3/08 |
| 2020/0097830 | A1* | 3/2020 | Deng | G06N 5/022 |
| 2020/0228840 | A1* | 7/2020 | Fracastoro | G06V 10/426 |
| 2020/0364545 | A1* | 11/2020 | Shattil | G06N 3/08 |
| 2021/0089884 | A1* | 3/2021 | Macready | G06N 3/08 |
| 2021/0248459 | A1* | 8/2021 | Li | G06N 3/08 |

OTHER PUBLICATIONS

Baskin, et al., (Oct. 2, 2018) UNIQ: Uniform Noise Injection for Non-Uniform Quantization of Neural Networks, arXiv:1804.10969v3. (Year: 2018).*

McCaffey, James, Test Run L1 and L2 Regularization for Machine Learning (Feb. 2015) Microsoft Magazine (Year: 2015).*

Cole's World of Mathematics (Feb. 7, 2016), Rationalizing the Numerator (an Algebra Skill Needed for Calculus, YouTube (Year: 2016).*

Reddit (2018) Why can I square a function I want to minimize/maximize (when it has a square root) and it doesn't change the result? (Year: 2018).*

StackExchange, (Mar. 16, 2016), Intuitively, why does squaring a loss function change optimal values? (Year: 2016).*

He, et al., On Time Delay Estimation From A Sparse Linear Prediction Perspective, The Journal of the Acoustic Society of America, 137, 1044, doi: 10.1121/1.4906267 (Year: 2015).*

Johnson, Justin (Sep. 6, 2017) "Derivatives, Backpropagation and Vectorization" Stanford University (Year: 2017).*

DeepLizard, "Flatten, Reshape, and Squeeze Explained—Tensors for Deep Learning with PyTorch" (last updated Sep. 28, 2018) (Year: 2018).*

Han, Song (Jan. 6, 2015) "Deep Compression and EIE"Stanford University (Year: 2015).*

Tibshirani, Robert (Jan. 1996) "Regression Shrinkage and Selection Via the Lasso" Journal of the Royal Statistical Society: Series B (Methodological), vol. 58, Issue 1, Jan. 1996, pp. 267-288 (Year: 1996).*

Yin, P., Esser, E. and Xin, J., 2014. Ratio and difference of I_1 and I_2 norms and sparse representation with coherent dictionaries. Commun. Inf. Syst., 14(2), pp. 87-109. (Year: 2014).*

Zou et al., English Translation of CN_108227024 (Year: 2018).*

Jiang et al., English Translation of CN_109188327 (Year: 2018).*

Office Action received for corresponding European Patent Application No. 20755596.2, dated Feb. 29, 2024, 11 pages.

Office action received for corresponding Finnish Patent Application 20195116, dated Sep. 26, 2019, 10 pages.

Yang et al., "Scalable Neural Network Compression and Pruning Using Hard Clustering and L1 Regularization", arXiv, Jun. 14, 2018, pp. 1-14.

Thom, "Sparse Neural Networks", Dissertation, 2014, 261 pages.

Courbariaux et al., "Binarized Neural Networks: Training Neural Networks with Weights and Activations Constrained to +1 or −1", arXiv, Mar. 17, 2016, 11 pages.

Zhou et al., "DoReFa-Net: Training Low Bitwidth Convolutional Neural Networks with Low Bitwidth Gradients", arXiv, Feb. 2, 2018, pp. 1-13.

Jung et al., "Learning to Quantize Deep Networks by Optimizing Quantization Intervals with Task Loss", arXiv, Nov. 23, 2018, 10 pages.

Aytekin et al., "Compressibility Loss for Neural Network Weights", arXiv, May 3, 2019, 7 pages.

International Search Report and Written Opinion received for corresponding Patent Cooperation Treaty Application No. PCT/FI2020/050045, dated May 5, 2020, 17 pages.

Hoyer, "Non-negative Matrix Factorization with Sparseness Constraints", Journal of Machine Learning Research, vol. 5, 2004, pp. 1457-1469.

Boo et al., "Structured Sparse Ternary Weight Coding of Deep Neural Networks for Efficient Hardware Implementations", arXiv, Jul. 1, 2017, 6 pages.

Wang et al., "Training neural networks with additive noise in the desired signal", IEEE Transactions on Neural Networks, vol. 10, No. 6, 1998, pp. 1084-1089.

Thimm et al., "Neural Network Initialization", International Workshop on Artificial Neural Networks, 1995, pp. 535-542.

Aytekin et al., "Block-optimized Variable Bit Rate Neural Image Compression", arXiv, May 28, 2018, pp. 1-4.

Yin et al., "Ratio and Difference of I1 and I2 Norms and Sparse Representation with Coherent Dictionaries", Communications in Information and Systems, vol. 14, No. 2, 2014, pp. 87-109.

Extended European Search Report received for corresponding European Patent Application No. 20755596.2, dated Nov. 24, 2022, 12 pages.

Train Neural Networks With Noise to Reduce Overfitting, Machine Learning Mastery, Retrieved on Nov. 30, 2022, Webpage available at : https://machinelearningmastery.com/train-neural-networks-with-noise-to-reduce-overfitting/.

"Xavier initialization and batch normalization, my understanding" , Shi Yan Medium, Retrieved on Nov. 30, 2022, Webpage available at : https://shiyan.medium.com/xavier-initialization-and-batch-normalization-my-understanding-b5b91268c25c.

Han et al., "Deep Compression: Compressing Deep Neural Networks with Pruning, Trained Quantization and Huffman Coding", arXiv, Feb. 15, 2016, pp. 1-14.

* cited by examiner

APPARATUS AND A METHOD FOR NEURAL NETWORK COMPRESSION

RELATED APPLICATION

This application was originally filed as PCT Application No. PCT/FI2020/050045, filed on Jan. 29, 2020, which claims priority from Finland Application No. 20195116, filed on Feb. 15, 2019, each of which is incorporated herein by reference in its entirety.

TECHNICAL FIELD

Various example embodiments relate to compression of neural network(s).

BACKGROUND

Neural networks are being utilized in an ever increasing number of applications for many different types of devices, such as mobile phones and various internet of things (IoT) devices. Neural networks may be used to e.g. image and video analysis and processing, social media data analysis and device usage data analysis.

Running neural network(s) require large memory and computational resources. Requirements for large memory and computational resources prohibits efficient use of neural networks and deployment of neural network(s) to devices having limited memory and computational resources, such as mobile phones and IoT devices. Further, transmission of neural networks among devices may be cumbersome, since transmission requires a lot of bandwidth.

There is, therefore, a need for an efficient representation of neural networks to reduce requirements for memory and reduce computational complexity and to enable efficient transmission of neural networks among devices.

SUMMARY

There is provided a method and technical equipment implementing the method, by which the above problems are alleviated. Various aspects of the invention include a method, an apparatus, and a computer program product comprising a computer program stored therein, which are characterized by what is stated in the independent claims. Various example embodiments are disclosed in the dependent claims.

According to a first aspect, there is provided an apparatus comprising means for training a neural network, wherein the training comprises applying a loss function configured to increase sparsity of a weight tensor of the neural network and to cause a plurality of non-zero elements of the weight tensor to be substantially equal to each other; and means for entropy coding the weight tensor to obtain a compressed neural network.

According to an embodiment, the means are further configured to perform providing the compressed neural network for transmission.

According to an embodiment, the loss function comprises at least one critical point, and wherein the loss function at the critical point corresponds to a sparse weight tensor, and wherein a plurality of non-zero elements of the sparse weight tensor are substantially equal to each other.

According to an embodiment, the loss function comprises a compression loss defined by an L1 norm of the weight tensor divided by an L2 norm of the weight tensor.

According to an embodiment, at least a portion of the elements of the sparse weight tensor are substantially equal to zero.

According to an embodiment, the loss function comprises a plurality of critical points comprising a first critical point and a second critical point, and wherein a first weight tensor corresponding to a first value of the loss function at a first critical point has a first number of substantially zero elements; a second weight tensor corresponding to a second value of the loss function at a second critical point has a second number of substantially zero elements, wherein the first number is higher than the second number; and wherein the first value of the loss function is lower than the second value of the loss function.

According to an embodiment, the loss function comprises a compression loss and a task-specific loss.

According to an embodiment, the means are further configured to perform quantizing the weight tensor.

According to an embodiment, the quantizing comprises approximating quantization by introducing additive noise to the weight tensor during training, wherein the additive noise level is defined by a first hyperparameter.

According to an embodiment, the quantizing is performed after training according to a set of hyperparameters comprising a first hyperparameter defining the additive noise level; a second hyperparameter defining a lower limit of a weight range; and a third hyperparameter defining an upper limit of the weight range.

According to an embodiment, the means are further configured to perform initializing the neural network randomly by applying a mapping function arranged such that the initialization falls into non-saturated region of the mapping function.

According to an embodiment, the means are further configured to perform adaptively changing weight initialization given the mapping function.

According to an embodiment, the means are further configured to perform initializing the neural network from a given seed by applying a mapping function arranged such that the seed falls into non-saturated region of the mapping function.

According to an embodiment, the means are further configured to perform adaptively changing the mapping function according to given weight initialization.

According to an embodiment, the means comprises at least one processor; at least one memory including computer program code; the at least one memory and the computer program code configured to, with the at least one processor, cause the performance of the apparatus.

According to a second aspect, there is provided a method comprising training a neural network, wherein the training comprises applying a loss function configured to increase sparsity of a weight tensor of the neural network and to cause a plurality of non-zero elements of the weight tensor to be substantially equal to each other; and entropy coding the weight tensor to obtain a compressed neural network.

According to a third aspect, there is provided a computer program product comprising computer program code configured to, when executed on at least one processor, cause an apparatus or a system to:

train a neural network, wherein the training comprises applying a loss function configured to increase sparsity of a weight tensor of the neural network and to cause a plurality of non-zero elements of the weight tensor to be substantially equal to each other; and entropy code the weight tensor to obtain a compressed neural network.

DESCRIPTION OF THE DRAWINGS

In the following, various example embodiments will be described in more detail with reference to the appended drawings, in which.

DESCRIPTION OF EXAMPLE EMBODIMENTS

Figure 1A:
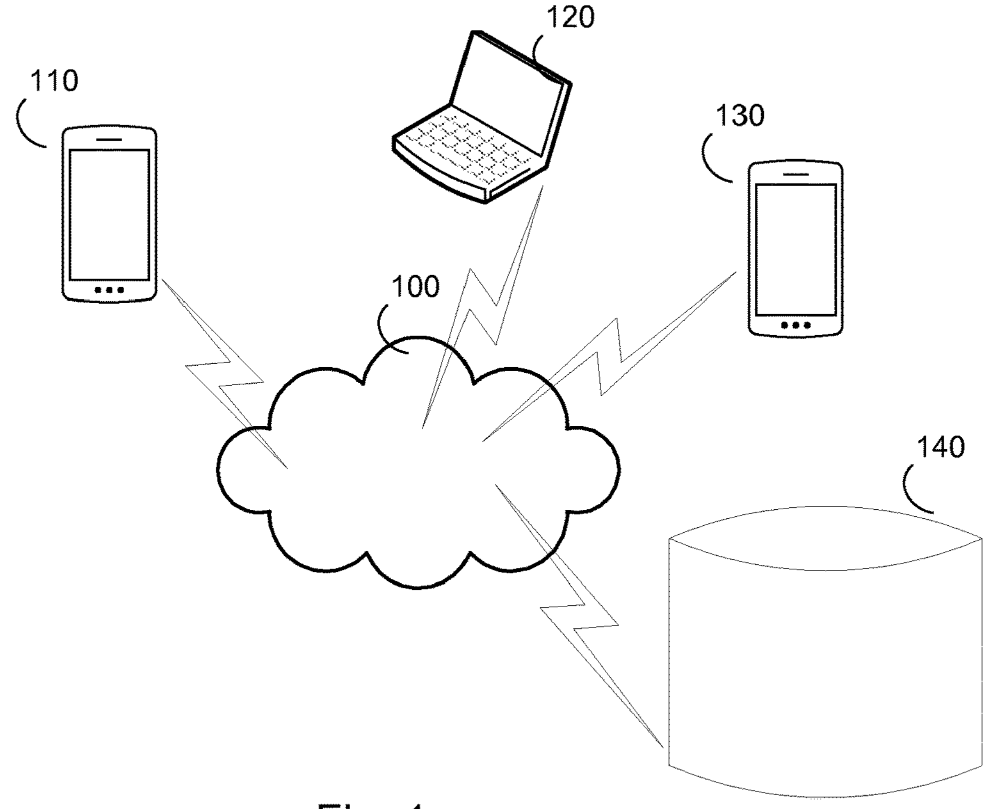
FIG. 1*a* shows, by way of example, a system and apparatuses in which compression of neural networks may be applied.

A neural network (NN) is a computation graph comprising several layers of computation. Each layer comprises one or more units, where each unit performs an elementary computation. A unit is connected to one or more other units, and the connection may have associated a weight. The weight may be used for scaling a signal passing through the associated connection. Weights may be learnable parameters, i.e., values which may be learned from training data. There may be other learnable parameters, such as those of batch-normalization (BN) layers.

The most widely used architectures for neural networks are feed-forward and recurrent architectures. Feed-forward neural networks are such that there is no feedback loop: each layer takes input from one or more of the layers before and provides its output as the input for one or more of the subsequent layers. Also, units inside a certain layer take input from units in one or more of preceding layers, and provide output to one or more of following layers. Initial layers, i.e. those close to the input data, extract semantically low-level features such as edges and textures in images, and intermediate and final layers extract more high-level features. After the feature extraction layers there may be one or more layers performing a certain task, such as classification, semantic segmentation, object detection, denoising, style transfer, super-resolution, etc. In recurrent neural networks, there is a feedback loop, so that the network becomes stateful, i.e., it is able to memorize information or a state.

The neural networks may be trained to learn properties from input data, either in supervised way or in unsupervised way. Such learning is a result of a training algorithm, or of a meta-level neural network providing a training signal. The training algorithm changes some properties of the neural network so that its output is as close as possible to a desired output. For example, in the case of classification of objects in images, the output of the neural network can be used to derive a class or category index which indicates the class or category that the object in the input image belongs to. Examples of classes or categories may be e.g. “person”, “cat”, “dog”, “building”, “sky”.

Training usually happens by changing the learnable parameters so as to minimize or decrease the output's error, also referred to as the loss. The loss may be e.g. a mean squared error or cross-entropy. In recent deep learning techniques, training is an iterative process, where at each iteration the algorithm modifies the weights of the neural network to make a gradual improvement of the network's output, i.e., to gradually decrease the loss.

Training a neural network is an optimization process, but the final goal is different from the typical goal of optimization. In optimization, the only goal is to minimize a functional. In machine learning, the goal of the optimization or training process is to make the model learn the properties of the data distribution from a limited training dataset. In other words, the goal is to learn to use a limited training dataset in order to learn to generalize to previously unseen data, i.e., data which was not used for training the model. This is usually referred to as generalization.

Data is usually split into at least two sets, the training set and the validation set. The training set is used for training the network, i.e., to modify its learnable parameters in order to minimize the loss. The validation set is used for checking the performance of the network on data which was not used to minimize the loss, as an indication of the final performance of the model. The errors on the training set and on the validation set are monitored during the training process to understand the following things:

If the network is learning at all—in this case, the training set error should decrease, otherwise the model is in the regime of underfitting.

If the network is learning to generalize—in this case, also the validation set error needs to decrease and to be not too much higher than the training set error. If the training set error is low, but the validation set error is much higher than the training set error, or it does not decrease, or it even increases, the model is in the regime of overfilling. This means that the model has just memorized the training set's properties and performs well only on that set, but performs poorly on a set not used for tuning its parameters.

The network to be trained may be e.g. a classifier neural network, such as a Convolutional Neural Network (CNN) capable of classifying objects or scenes in input images.

Neural networks that perform very well are usually overparametrized, i.e., they comprise more weights and/or other learnable parameters than what is actually needed for the task at hand. This overparametrization is considered to help to achieve better test time accuracy since it prevents Stochastic Gradient Descent (SGD) based training methods to get stuck in a local minimum. However, the resulting model is highly redundant and requires large memory to store. This prohibits efficient use of neural networks and deployment of neural networks to devices having limited memory and computational resources, such as mobile phones and IoT devices. Further, transmission of neural networks among devices requires a lot of bandwidth. Transmission of neural networks among devices is needed e.g. in distributed learning scenarios.

There is provided a method and an apparatus to enable compressed representation of neural networks and efficient transmission of neural network(s) among devices.

FIG. 1*a* shows, by way of example, a system and apparatuses in which compression of neural networks may be applied. The different devices 110, 120, 130, 140 may be connected to each other via a communication connection 100, e.g. vie Internet, a mobile communication network, Wireless Local Area Network (WLAN), Bluetooth®, or other contemporary and future networks. Different networks may be connected to each other by means of a communication interface. The apparatus may be e.g. a server 140, a personal computer, a laptop 120 or a smartphone 110, 130. The apparatus may comprise and be able to run at least one neural network, or a portion thereof. The one or more apparatuses may be part of a distributed computation scenario, wherein there is a need to transmit neural network(s) from one apparatus to another. Data for training the neural network may be received by the one or more apparatuses e.g.

from a database such as a server 140. Data may be e.g. image data, video data etc. Image data may be captured by the apparatus 110, 130 by itself, e.g. using a camera of the apparatus.

Figure 1B:
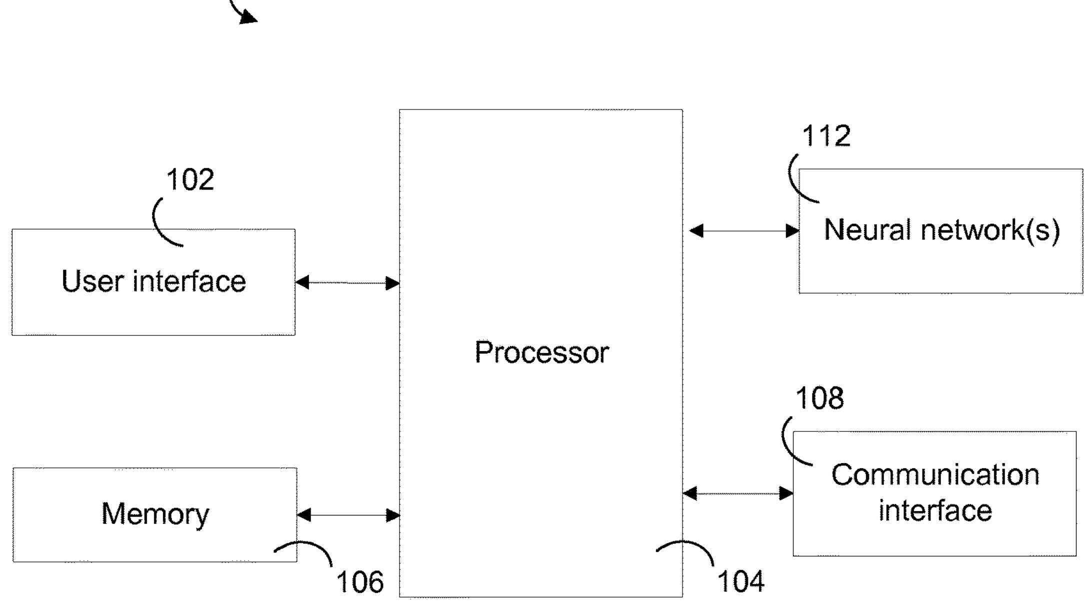
FIG. 1*b* shows, by way of example, a block diagram of an apparatus for neural network compression.

FIG. 1*b* shows, by way of example, a block diagram of an apparatus 110, 130. The apparatus may comprise a user interface 102. The user interface may receive user input e.g. through a touch screen and/or a keypad. Alternatively, the user interface may receive user input from internet or a personal computer or a smartphone via a communication interface 108. The apparatus may comprise means such as circuitry and electronics for handling, receiving and transmitting data. The apparatus may comprise a memory 106 for storing data and computer program code which can be executed by a processor 104 to carry out various embodiment of the method as disclosed herein. The apparatus may comprise and be able to run at least one neural network 112. The elements of the method may be implemented as a software component residing in the apparatus or distributed across several apparatuses. Processor 104 may include processor circuitry. The computer program code may be embodied on a non-transitory computer readable medium.

As used in this application, the term "circuitry" may refer to one or more or all of the following: (a) hardware-only circuit implementations (such as implementations in only analog and/or digital circuitry) and (b) combinations of hardware circuits and software, such as (as applicable):

(i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions) and (c) hardware circuit(s) and or processor(s), such as a microprocessor(s) or a portion of a microprocessor(s), that requires software (e.g., firmware) for operation, but the software may not be present when it is not needed for operation."

This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

Figure 2:
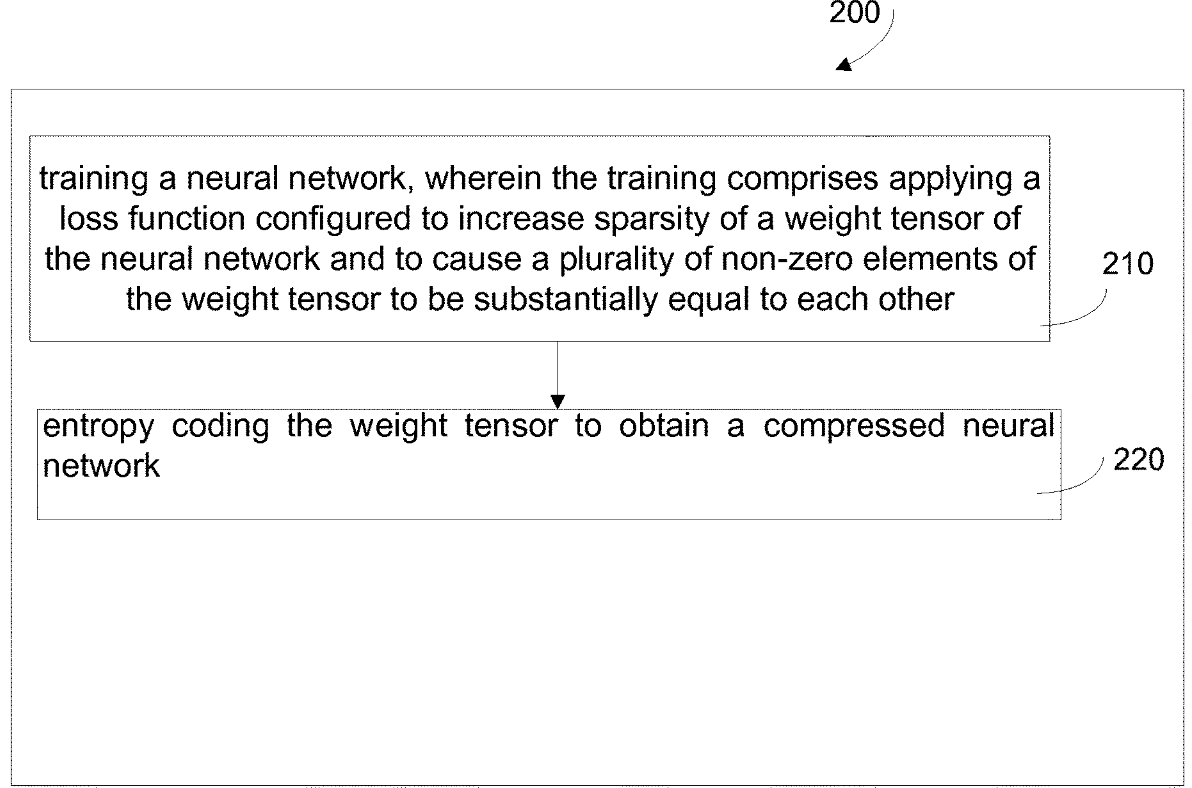
FIG. 2 shows, by way of example, a flowchart of a method for neural network compression.

FIG. 2 shows, by way of an example, a flowchart of a method 200 for neural network compression. The method 200 comprises training 210 a neural network, wherein the training comprises applying a loss function configured to increase sparsity of a weight tensor of the neural network and to cause a plurality of non-zero elements of the weight tensor to be substantially equal to each other. The method 200 comprises entropy coding 220 the weight tensor to obtain a compressed neural network.

Training neural networks by applying a loss function configured to increase sparsity of a weight tensor of the neural network and to cause a plurality of non-zero elements of the weight tensor to be substantially equal to each other causes the trained neural network(s) to be highly compressible. The method enables efficient, compressed representation of neural network while keeping similar performance with respect to the uncompressed network. The compressed neural network requires less memory to store and less computational resources. Run-time complexity and memory complexity may be reduced with the compressed neural network. A neural network with a lot of sparse weights may perform less computations during run-time. Also, when transmitting the compressed neural network, e.g. by sending the compressed neural network over the internet, the required bandwidth is much less than when sending the original, uncompressed model.

The loss function comprises a compression loss. When the compression loss is optimized, e.g. minimized, it allows for finding a weight tensor which is sparse, i.e. several weights have a value close to zero or have a value of zero, and the remaining non-zero weights have similar values i.e. are substantially equal to each other. Non-zero weights having similar values means that they come from a distribution that has low entropy, and thus are highly compressible.

The compression loss applied in the method disclosed herein has desired properties. The loss function may comprise at least one critical point. A critical point refers to a point where the derivative of the loss function is equal to zero. In practice, a point may be considered to be a critical point if the value of the derivative is substantially zero. Loss function at the critical point corresponds to a sparse weight tensor and a plurality of non-zero elements of the sparse weight tensor are substantially equal to each other. In other words, critical points are reached by the optimization process when the weight tensor is sparse and the remaining non-zero weights have similar values. Critical points of the loss function with low loss value correspond to a set of weights where a high number of weights have value near zero or zero. Critical points of the loss function with high loss value correspond to a set of weights where a low number of weights have value near zero or zero. At the critical points, absolute values of non-zero elements of the set of weights on which the loss function is computed are substantially equal to each other.

According to an embodiment, the loss function comprises a compression loss defined by an L1 norm of the weight tensor divided by an L2 norm of the weight tensor. This is written as $$L_c(x) = \frac{|x|}{\|x\|}, \tag{1}$$

wherein |x|, ||x|| stand for the L1 and L2 norm of the vector x respectively. Vector is one type of a tensor.

In order to theoretically validate the compression aspect of the compression loss of Equation (1), the following theorem is presented and proved.

Theorem 1: Let x be any vector, then (i) critical points of the compression loss $$L_c(x) = \frac{|x|}{\|x\|}$$

are reached by the optimization process when the weight tensor x is sparse, i.e., several weights have value near zero. At critical points, lower values of the loss function correspond to higher percentage of weights having value near zero.

(ii) absolute values of non-zero elements of x at the critical point are the same.

Proof of Theorem 1: We first take the derivative of the compression loss function w.r.t x and equate it to zero in order to find the critical points of the loss function.

$$\frac{\partial L_c(x)}{\partial x} = \left(\frac{\operatorname{sign}(x)}{\|x\|} + \frac{-|x|}{\|x\|^2}\frac{|x|}{\|x\|}\right) = 0 \quad (2)$$

$$\|x\|^2 \operatorname{sign}(x) = |x| x \quad (3)$$

For $x_i=0$ the equation directly holds. For $\operatorname{sign}(x_i)=1$ ($x_i>0$), $\|x\|^2=|x|x_i$ must hold. Given a vector x, $\|x\|^2$ and $|x|$ are fixed numbers (one is squared l2 norm and the other is l1 norm), then $c=x_i$ holds for all i. ($c=\|x\|^2/|x|$). Similarly, for $\operatorname{sign}(x_i)=-1$ ($x_i<0$), $-c=x_i$ must hold. So this proves (ii).

So x at critical point is a vector of (0, c, −c). The compression loss at critical point is then:

$$L_c(x) = \frac{|x|}{\|x\|} = \frac{cN}{\sqrt{Nc^2}} = \sqrt{N},$$

where N is the number of non-zero elements in vector x. As the compression loss increases the sparsity decreases. This proves (i).

Theorem 1.i covers the sparsity aspect of the loss. Theorem 1.ii covers the compressibility aspect of the non-zero elements in vector x, since it shows that the non-zero elements in the critical point are identical making the non-zero part of the vector x binary-like with only two elements (c or −c). Both 1.i and 1.ii are beneficial for entropy encoding the vector, as its entropy is low.

Above we have shown that compression loss $$L_c(x) = \frac{|x|}{\|x\|}$$

has the desired properties described above. However, the compression loss may have other formats that provide the same effects. Using the above compression loss as an example, one can start from equation (3), assuming that this is the desired property, and in order for this to be the local minima of the loss function, one can integrate over x and end up with Equation (1). In a similar way, other suitable compression losses could be obtained by designing a desired point, such as Equation (3), and integrating over x and obtain the loss function. The L2L1 loss $$\frac{|x|}{\|x\|}$$

is an example or this general procedure.

Another compression loss that also satisfies the compressibility in both sparsity and quantizability aspect is proposed below:

$$L_c(x) = \frac{|x|}{\|x\|} + \gamma\frac{\|x\|^2}{|x|} \quad (4)$$

Theorem 2: Let x be any vector, then for certain values of $\gamma$ (i) critical points of the compression loss $$L_c(x) = \frac{|x|}{\|x\|} + \gamma\frac{\|x\|^2}{|x|}$$

are reached by the optimization process when the weight tensor x is sparse, i.e., several weights have value near zero. At critical points, lower values of the loss function correspond to higher percentage of weights having value near zero.

(ii) absolute values of non-zero elements of x at the critical point are the same.

Proof of Theorem 2: We first take the derivative of the compression loss function w.r.t x and equate it to zero in order to find the critical points of the loss function.

$$\frac{\partial L_c(x)}{\partial x} = \left(\frac{\operatorname{sign}(x)}{\|x\|} + \frac{-|x|}{\|x\|^2}\frac{|x|}{\|x\|} + \gamma\frac{2x}{|x|} - \gamma\frac{\operatorname{sign}(x)\|x\|^2}{|x|^2}\right) = 0 \quad (5)$$

$$\|x\|^2(|x|^2 - \gamma\|x\|^3)\operatorname{sign}(x) = |x|x(|x|^2 - \|x\|^3 2\gamma) \quad (6)$$

For $x_i=0$ the equation directly holds. As long $\operatorname{sign}(|x|^2-\gamma\|x\|^3)=\operatorname{sign}(|x|^2-\|x\|^3 2\gamma)$, For $\operatorname{sign}(x_i)=1$ ($x_i>0$), $\|x\|^2=|x|x_i$ must hold. Given a vector x, $\|x\|^2$ and $|x|$ are fixed numbers (one is squared l2 norm and the other is l1 norm), then $c=x_i$ holds for all i. ($c=\|x\|^2/|x|$). Similarly, for $\operatorname{sign}(x_i)=-1$ ($x_i<0$), $-c=x_i$ must hold. So this proves (ii).

So x at critical point is a vector of (0, c, −c). The compression loss at critical point is then:

$$L_c(x) = \frac{|x|}{\|x\|} + \gamma\frac{\|x\|^2}{|x|} = \sqrt{N} + \gamma c,$$

where N is the number of non-zero elements in vector x. As the compression loss increases the sparsity decreases. This proves (i).

The criterion $\operatorname{sign}(|x|^2-\gamma\|x\|^3)=\operatorname{sign}(|x|^2-\|x\|^3 2\gamma)$ can be easily satisfied with certain selections of $\gamma$ such as $$\gamma = \frac{|x|^2}{3\|x\|^3}.$$

According to an embodiment, at least a portion or a subset of the elements of the sparse weight tensor are substantially equal to zero (0). The more elements are substantially equal to zero, the higher is the sparsity, and the more compressible is the neural network. An element may be considered substantially zero if the distance to zero is for example less than 0.01, but any other suitable threshold may be used depending on the situation, for example values of the other elements in the weight tensor.

An example of a good weight vector in terms of compressibility is [0 0 0 0 0 0 0 1 0 0 −1] as most elements of the weight vector are zero and non-zero elements comes from a binary distribution (either 1 or −1) so the non-zero parts can be encoded with binary values.

The loss function may comprise a plurality of critical points. The plurality of critical points may comprise a first, second, third, etc. critical points. As described above, at critical points, lower values of the loss function correspond to a higher percentage, or number, of weights having value near zero or zero. In other words, the lower the value of the loss function at a critical point, the higher percentage, or number, of weights have value near zero or zero. Let us consider a first weight tensor corresponding to a first value of the loss function at a first critical point having a first number of substantially zero elements. Let us consider a second weight tensor corresponding to a second value of the loss function at a second critical point having a second number of substantially zero elements. The first number is higher than the second number. The first value of the loss function is lower than the second value of the loss function. Thus, the more the loss function is minimized, the higher is the sparsity, and the more compressible is the neural network.

The loss function comprises the compression loss which may be an additional loss to the task-specific loss ($L_t$). The task-specific loss is commonly used to train the neural networks. $L_t$ can be any suitable task-specific loss, e.g. a categorical cross entropy loss for data classification task or a mean squared error for image filtering or reconstruction.

The combination of task loss and compressibility loss might not be straightforward since the magnitudes of both losses might not be compatible. For very large networks, compression loss may be very large since it is related to number of parameters. At critical points loss has a part of sqrt(N). Therefore, the weighting can be adapted during the training via checking the losses on the fly and adapting the weight on compressibility loss such that the compressibility loss is a desired portion of the task loss.

$L_c$ may be, for example, applied to any proportion of the weights of the neural network. The weights may comprise the bias parameters of the fully connected or convolutional layers. This proportion may be based on a rule, such as applying $L_c$ separately to each layer, to each bias and/or to each kernel weight. Another example is to apply $L_c$ to several layers' weights. The vector that the loss is to be applied is the concatenation of all flattened (vectorized) weights/biases/parameters that we wish the loss to apply.

Hence, the total loss when training a neural network may be formulated as follows:

$$L_t + \sum_i \lambda_i L_c(x_i) \tag{4}$$

where $x_i$ refers to any proportion of neural network kernel weights/activations and $\lambda_i$ is the corresponding weight for applying compression loss to this specific portion.

According to an embodiment, the weight tensor is quantized. In other words, the weights or biases of the neural network layers are quantized. Quantization causes the tensor to be more easily compressed. For example, let us consider a first vector [0.001 0.002 0.003 12.001 12.002] and a second vector [0 0 0 12 12]. The first vector and the second vector are very similar. However, the compressing the first vector is more difficult than the second vector, since the second vector is quantized. The amount of actual sparsity is higher in the latter vector, since in the former vector the values in corresponding indices are still larger than zero, although they are very small. Thus, quantization of weights or biases is an important aspect to be considered for compression.

Quantization may comprise approximating the quantization during training such that the neural network would learn to be robust to quantization after training. This way the possibly decreased performance of the neural network caused by direct quantization of the weights after training, based on a uniform or non-uniform quantization, may be avoided. The performance may decrease, since the neural network is not robust to direct quantization after training.

Quantization may be approximated by introducing additive noise to the weight tensor during training. The additive noise level may be defined by a first hyperparameter μ. The first hyperparameter μ may be pre-defined.

Let us consider the weight being in the interval [a, b] where a and b may be pre-defined. a is a second hyperparameter defining a lower limit of a weight range [a, b], and b is a third hyperparameter defining an upper limit of the weight range [a, b]. Then a uniform quantization would be applied such that this interval is divided into equal length intervals where each end of the sub-interval define the quantized value, e.g [a, a+μ, a+2μ, . . . , b−2μ, b−μ, b]. Then, one can approximate the quantization by additive random noise. For example, if a number a+0.6μ is to be quantized to a+μ, the additive "noise" here is 0.4μ, since 0.6μ+0.4μ=μ. Theoretically, this additive noise changes in the interval [−0.5μ, 0.5μ]. Therefore, one way to make the network robust to quantization is to randomly add noise, e.g. in interval [−0.5μ, 0.5μ], to the weights or biases of neural network layers to be quantized.

Leaving a and b undefined would result into automatic finding of a and b based on the minimum and maximum values of weights or biases. This would change the level of quantization since μ is pre-defined, and therefore it may be desirable to pre-define a and b as well.

Hyperparameters a and b may be set to 0 and 1, respectively, which may be achieved by a sigmoid nonlinearity. Alternatively, the hyperparameters a and b may be set to −1 and 1, respectively, which may be achieved by a tanh, i.e. hyperbolic tangent, nonlinearity. Since the end-goal is the compression of the weights, we would like to have sparsity in weights, i.e. we would like to have many weights to be near zero or 0. If one considers to set a and b to 0 and 1 by using a sigmoid nonlinearity, then the derivative of the sigmoid nonlinearity towards 0 output is very low. Because of this, it may be hard to learn values that are close to zero, or to recover from it. Therefore, a mapping, which is described later, may be applied that maps the weight or bias values to an interval where the mapping have good derivatives around points where the mapping outputs zero. Good derivatives may be derivatives having values close to 1.

[a, b] interval may comprise negative values.

The hyperparameters μ, a and b may be selected differently for any proportion, or groups, of the weights or biases. The hyperparameters for each group of weights or biases may be arranged such that the required quantization level is achieved. For example, one layer's weights may be quantized to 6 bits, another layer's weights may be quantized to 4 bits. The appropriate quantization parameters may be selected to ensure a good trade-off between compression and accuracy. For example, it may be enough for some weights to be quantized with 4 bits to ensure a good performance, whereas some weights may need to be quantized by 6 bits. In order to automate this method, the hyperparameters related to quantization may be learned.

Thus, the hyperparameters μ, a and b may be set manually or they may be automatically learned, such that the required quantization level is achieved. The hyperparameters may be selected, for example, such that more compression will be made in the deeper layers, e.g. especially in the last dense layer. In other words, since the final dense layer has many parameters, one might expect it to be more redundant, whereas usually the initial layers of CNNs are less redundant and therefore may be compressed with higher bit-rates.

The neural networks learn e.g. by gradient descent, and the higher the derivative, the larger weight-update may be made. Also, as gradients get multiplied in successive layers, multiplying gradients which are less than 1 would result in extremely low gradients—this is usually referred to as vanishing gradient, and it results into insignificant weight-updates. On the other end, having too large derivative may result into exploding gradient due to the multiplication of gradients in successive layers, which may make the training process to diverge. Thus, in practice, it is preferable to have derivatives which are not too small and not too large, such as near the value 1.

The neural network to be trained may be trained from any starting point. For example, the neural network may be initialized, e.g. randomly, before training. Alternatively, training may be started from a given seed, e.g. the neural network may be a pretrained network. When the network is initialized randomly, e.g. from a uniform distribution, a mapping function may be applied which is arranged such that the initialization falls into non-saturated region of the mapping function. Similarly, when the network is initialized from a given seed, a mapping function may be applied which is arranged such that the seed falls into non-saturated region of the mapping function. The weights or biases are then considered as the ones after the mapping.

The mapping function maps the weight or bias values to an interval where the mapping has good derivatives, i.e. neither exploding nor vanishing, around points where the mapping outputs zero. The mapping function may be e.g. tanh(x). However, this mapping may be generalized to other suitable functions that has derivative taking values close to 1 when the input to the function is near 0. In general, a derivative of a preferred mapping function, prior to quantization, for sparsity goal has a suitable value for training at value 0, i.e. when the mapping outputs 0. Suitable here means that the derivative is not very high so that gradients do not explode, and/or not very small so that gradients do not vanish.

According to an embodiment, the weight initialization may be adaptively changed given the mapping function or the mapping function may be adaptively changed according to given weight initialization. This is beneficial e.g. in the following situation wherein the weights are already at the initialization phase in the saturated region, which is harmful for learning. For example, let us consider that the mapping function is tanh(x). This function already saturates for input values x larger than 3 or smaller than −3. Thus, if the initialization of the weights involves values much larger than 3 or much smaller than −3, the weights are already in the saturated region, which is not good for learning. In order to solve this issue it is proposed to adaptively change either the mapping function according to given weight initialization, or change weight initialization given the mapping function. In the latter alternative, one may use for example tanh(x) directly, but initialize the weights such that they fall well into the unsaturated regions of than tanh(x) function.

When the mapping function is adaptively changed according to given weight initialization, one may be required to start the training from a given seed, e.g. from a pretrained network, when there might be no flexibility to change the initialization. In such a case, the mapping function e.g. the tanh(x) may be modified such that it stretches or squeezes based on the provided weights. The squeeze or stretch operations may be implemented by changing tanh(x) to tanh(ax) where a is the factor that determines the level of stretching or squeezing. For example, a may be determined such that the derivative of the mapping function tanh(ax) is a reasonable value, i.e. not saturating, i.e. larger than zero in magnitude, at the points where x takes minimum and maximum values. As a preferable example, the derivative may be reasonably larger than zero, i.e. rather closer to 1 than very close to zero.

As in the squeezing or stretching case, a shift on the mapping function may be arranged so that the shifting mapping's derivative will be a high value in the mean of x (activations) over the dataset.

One can also alternatively not apply any quantization or pruning approximation during training and train the neural network with task and compressibility loss with any initialization and without introducing additional mapping strategies. In this case for example, when the training is completed one can simply prune weights with low absolute value (according to a threshold) and one can apply any kind of quantization approach on remaining values.

After the pruning and quantization one can code the zero elements in a binary mask that indicates which element is zero and which is not. Then, the non-zero elements can be represented with their labels. Then when the neural network is compressed, one may save: the neural network architecture, binary mask indicating zero-non-zero elements, labels for non-zero elements and dictionary of quantization.

The method disclosed herein may further comprise one or more embodiments. According to an embodiment, the method further comprises providing the compressed neural network for transmission.

According to an embodiment, the loss function comprises at least one critical point, and wherein the loss function at the critical point corresponds to a sparse weight tensor, and wherein a plurality of non-zero elements of the sparse weight tensor are substantially equal to each other.

According to an embodiment, the loss function comprises a compression loss defined by an L1 norm of the weight tensor divided by an L2 norm of the weight tensor.

According to an embodiment, at least a portion of the elements of the sparse weight tensor are substantially equal to zero.

According to an embodiment, the loss function comprises a plurality of critical points comprising a first critical point and a second critical point, and wherein a first weight tensor corresponding to a first value of the loss function at a first critical point has a first number of substantially zero elements; a second weight tensor corresponding to a second value of the loss function at a second critical point has a second number of substantially zero elements, wherein the first number is higher than the second number; and wherein the first value of the loss function is lower than the second value of the loss function.

According to an embodiment, the loss function comprises a compression loss and a task-specific loss.

According to an embodiment, the method comprises quantizing the weight tensor.

According to an embodiment, the quantizing comprises approximating quantization by introducing additive noise to the weight tensor during training, wherein the additive noise level is defined by a first hyperparameter.

According to an embodiment, the quantizing is performed after training according to a set of hyperparameters comprising a first hyperparameter defining the additive noise level; a second hyperparameter defining a lower limit of a weight range; and a third hyperparameter defining an upper limit of the weight range.

According to an embodiment, the method further comprises initializing the neural network randomly by applying a mapping function arranged such that the initialization falls into non-saturated region of the mapping function.

According to an embodiment, the method further comprises adaptively changing weight initialization given the mapping function.

According to an embodiment, the method further comprises initializing the neural network from a given seed by applying a mapping function arranged such that the seed falls into non-saturated region of the mapping function.

According to an embodiment, the method further comprises adaptively changing the mapping function according to given weight initialization.

It is obvious that the present invention is not limited solely to the above-presented embodiments, but it can be modified within the scope of the appended claims.

The invention claimed is:

1. An apparatus comprising:

at least one processor; and at least one memory storing instructions that, when executed by the at least one processor, cause the apparatus at least to:

train a neural network, wherein to train the neural network, the apparatus is further caused to apply a loss function configured to increase a sparsity of a weight tensor of the neural network;

wherein the loss function comprises a task loss added to: a compression loss weight multiplied with a compression loss;

wherein the compression loss of the loss function is defined by: an L1 norm of the weight tensor of the neural network divided by an L2 norm of the weight tensor of the neural network added to a transformation factor that is multiplied with a square of the L2 norm of the weight tensor of the neural network divided by the L1 norm of the weight tensor of the neural network;

entropy encode the weight tensor of the neural network to obtain a compressed neural network, wherein the sparsity of the weight tensor of the neural network is increased following the training of the neural network by applying the loss function configured to increase the sparsity of the weight tensor of the neural network to obtain a sparse weight tensor of the neural network;

wherein at least a portion of elements of the sparse weight tensor of the neural network are substantially equal to zero such that an absolute value of a difference between a value of any element of the portion of elements of the sparse weight tensor of the neural network and zero is less than or equal to a threshold; and transmit the compressed neural network over a communication network to at least one device.

2. The apparatus according to claim 1, wherein the loss function comprises at least one critical point, and wherein the loss function at the critical point corresponds to the sparse weight tensor of the neural network, and wherein a plurality of non-zero elements of the sparse weight tensor of the neural network have the same absolute value.

3. The apparatus according to claim 1, wherein the loss function comprises a compression loss defined by the L1 norm of the weight tensor of the neural network divided by the L2 norm of the weight tensor of the neural network.

4. The apparatus according to claim 1, wherein the loss function comprises a plurality of critical points comprising a first critical point and a second critical point, and wherein a first weight tensor of the neural network corresponding to a first value of the loss function at the first critical point comprises a first number of elements that are substantially equal to zero such that an absolute value of a difference between a value of any element of the first number of elements of the first weight tensor of the neural network and zero is less than or equal to a threshold;

a second weight tensor of the neural network corresponding to a second value of the loss function at the second critical point comprises a second number of elements that are substantially equal to zero such that an absolute value of a difference between a value of any element of the second number of elements of the second weight tensor of the neural network and zero is less than or equal to a threshold; and wherein the first number is higher than the second number; and wherein the first value of the loss function is lower than the second value of the loss function.

5. The apparatus according to claim 1, wherein during training, the apparatus causes a plurality of non-zero elements of the weight tensor of the neural network to have the same absolute value.

6. The apparatus according to claim 1, wherein the apparatus is further caused to:

quantize the weight tensor of the neural network.

7. The apparatus according to claim 6, wherein to quantize the weight tensor of the neural network, the apparatus is further caused to:

approximate quantization by introducing additive noise to the weight tensor of the neural network during training, wherein the additive noise level is defined by a first hyperparameter.

8. The apparatus according to claim 6, wherein the quantizing is performed after training according to a set of hyperparameters comprising a first hyperparameter defining the additive noise level;

a second hyperparameter defining a lower limit of a weight range; and a third hyperparameter defining an upper limit of the weight range.

9. The apparatus according to claim 1, wherein the apparatus is further caused to:

initialize the neural network randomly by applying a mapping function arranged such that the initialization falls into non-saturated region of the mapping function.

10. The apparatus according to claim 9, wherein the apparatus is further caused to:

adaptively change weight initialization given the mapping function.

11. The apparatus according to claim 9, wherein the apparatus is further caused to:

adaptively change the mapping function according to a given weight initialization.

12. The apparatus according to claim 1, wherein the apparatus is further caused to:

initialize the neural network from a given seed by applying a mapping function arranged such that the seed falls into non-saturated region of the mapping function.

13. The apparatus of claim 1, wherein the at least one memory stores instructions that, when executed by the at least one processor, cause the apparatus at least to:

obtain the weight tensor of the neural network by flattening tensors representing learnable parameters of the neural network.

14. A method comprising:

training a neural network, wherein the training comprises applying a loss function configured to increase a sparsity of a weight tensor of the neural network;

wherein the loss function comprises a task loss added to: a compression loss weight multiplied with a compression loss;

wherein the compression loss of the loss function is defined by: an L1 norm of the weight tensor of the neural network divided by an L2 norm of the weight tensor of the neural network added to a transformation factor that is multiplied with a square of the L2 norm of the weight tensor of the neural network divided by the L1 norm of the weight tensor of the neural network;

entropy coding the weight tensor of the neural network to obtain a compressed neural network, wherein the sparsity of the weight tensor of the neural network is increased following the training of the neural network by applying the loss function configured to increase the sparsity of the weight tensor of the neural network to obtain a sparse weight tensor of the neural network;

wherein at least a portion of elements of the sparse weight tensor of the neural network are substantially equal to zero such that an absolute value of a difference between any element of the portion of elements of the sparse weight tensor of the neural network and zero is less than or equal to a threshold; and transmitting the compressed neural network over a communication network to at least one device.

15. The method according to claim 14, wherein the loss function comprises at least one critical point, and wherein the loss function at the critical point corresponds to the sparse weight tensor of the neural network, and wherein a plurality of non-zero elements of the sparse weight tensor of the neural network have the same absolute value.

16. A non-transitory computer readable storage medium comprising instructions stored thereon that cause an apparatus or a system to:

train a neural network, wherein the training comprises applying a loss function configured to increase a sparsity of a weight tensor of the neural network;

wherein the loss function comprises a task loss added to: a compression loss weight multiplied with a compression loss;

wherein the compression loss of the loss function is defined by: an L1 norm of the weight tensor of the neural network divided by an L2 norm of the weight tensor of the neural network added to a transformation factor that is multiplied with a square of the L2 norm of the weight tensor of the neural network divided by the L1 norm of the weight tensor of the neural network;

entropy encode the weight tensor of the neural network to obtain a compressed neural network, wherein the sparsity of the weight tensor of the neural network is increased following the training of the neural network by applying the loss function configured to increase the sparsity of the weight tensor of the neural network to obtain a sparse weight tensor of the neural network;

wherein at least a portion of elements of the sparse weight tensor of the neural network are substantially equal to zero such that an absolute value of a difference between any element of the portion of elements of the sparse weight tensor of the neural network and zero is less than or equal to a threshold; and transmit the compressed neural network over a communication network to at least one device.

* * * * *